United States Patent
Kasajima

(10) Patent No.: US 7,555,947 B2
(45) Date of Patent: Jul. 7, 2009

(54) AIR PRESSURE SENSOR

(75) Inventor: Tamon Kasajima, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 0 days.

(21) Appl. No.: 11/855,444

(22) Filed: Sep. 14, 2007

(65) Prior Publication Data

US 2008/0068742 A1 Mar. 20, 2008

(30) Foreign Application Priority Data

Sep. 19, 2006 (JP) ............................. 2006-252057

(51) Int. Cl.
H01L 41/113 (2006.01)
G01F 1/34 (2006.01)
H01L 41/22 (2006.01)
G11B 21/02 (2006.01)
G11B 5/596 (2006.01)
G11B 33/14 (2006.01)
G11B 5/54 (2006.01)

(52) U.S. Cl. ........................ 73/384; 360/97.02; 360/75; 360/77.03; 29/25.35; 310/323.21; 702/47

(58) Field of Classification Search ................ None
See application file for complete search history.

(56) References Cited

U.S. PATENT DOCUMENTS

| 2,105,010 | A | * | 1/1938 | Sawyer | 381/190 |
| 3,461,416 | A | * | 8/1969 | Kaufman | 338/4 |
| 4,106,343 | A | * | 8/1978 | Cook | 73/387 |
| 5,251,264 | A | * | 10/1993 | Tichy | 381/173 |
| 5,293,095 | A | * | 3/1994 | Tamura et al. | 310/338 |
| 5,763,787 | A | * | 6/1998 | Gravel et al. | 73/756 |
| 5,825,581 | A | * | 10/1998 | Morita et al. | 360/78.04 |
| 6,011,666 | A | * | 1/2000 | Wakamatsu | 360/69 |
| 6,067,203 | A | * | 5/2000 | Ottesen et al. | 360/73.03 |
| 6,603,628 | B1 | * | 8/2003 | Gillis et al. | 360/75 |
| 6,680,806 | B2 | * | 1/2004 | Smith | 360/75 |
| 6,700,726 | B1 | * | 3/2004 | Gillis et al. | 360/75 |
| 6,713,942 | B2 | * | 3/2004 | Raman et al. | 310/316.01 |
| 6,867,532 | B2 | * | 3/2005 | Brady et al. | 310/323.02 |
| 6,941,815 | B2 | * | 9/2005 | Onose et al. | 73/726 |
| 7,079,348 | B2 | * | 7/2006 | Ishii et al. | 360/75 |
| 7,080,553 | B2 | * | 7/2006 | Luo et al. | 73/514.05 |

FOREIGN PATENT DOCUMENTS

JP 3191459 5/2001

* cited by examiner

Primary Examiner—K. Wong
(74) Attorney, Agent, or Firm—Greenblum & Bernstein, P.L.C.

(57) ABSTRACT

An air pressure sensor capable of measuring air pressure highly accurately with a simple configuration is provided. The sensor includes: a sealed case with a sealed space formed therein; a first thin plate member which constitutes at least a part of the wall of the sealed case and deforms to allow the capacity of the sealed space to vary corresponding to changes in the outside air pressure; a first PZT which contacts the first thin plate member to thereby detect the natural frequency thereof; and a second thin plate member which has the same vibration characteristics as those of the first thin plate member and is provided outside the sealed case while contacting it; and a second PZT which has the same temperature characteristics as those of the first PZT and contacts the second thin plate member to thereby detect the natural frequency thereof.

22 Claims, 11 Drawing Sheets

APPLIED VOLTAGE PROFILE

AIR PRESSURE SENSOR

BACKGROUND OF THE INVENTION

1. Field of the Invention

The present invention relates to an air pressure sensor, and in particular, to a vibration-type air pressure sensor.

2. Related Art

As an air pressure sensor for measuring air pressure, a vibration-type air pressure sensor, as disclosed in Japanese Patent No. 3191459 (Patent Document 1), has been known. A vibration-type air pressure sensor measures the natural frequency of a vibrator, which varies depending on the pressure of a gas, by using a piezoelectric device to thereby measure the air pressure. Such an air pressure sensor is used to measure the height, for example.

[Patent Document 1] JP 3191459 B

However, a vibration-type air pressure sensor involves temperature drift, that is, the sensor has such a feature that the characteristics of a piezoelectric device for measuring the natural frequency of a vibrator changes corresponding to the temperature. This causes a problem that a measurement error may be caused as the surrounding temperature changes. Specifically, in a PZT, the natural frequency to be detected changes by 3 kHz in a range from 20 to 85°. In particular, the amount of change increases in the high temperature side. In the case of using the air pressure sensor in an altimeter, if a measurement error of 3 kHz is caused, an error of 300 m may be caused, which results in a problem of low measurement accuracy.

SUMMARY OF THE INVENTION

In view of the above, it is an object of the present invention to provide an air pressure sensor capable of measuring air pressure highly accurately with a simple configuration, while solving the inconveniences involved in the conventional example.

In order to achieve the object, an air pressure sensor, which is an aspect of the present invention, includes: a sealed case in which a sealed space is formed therein; a first thin plate member which constitutes at least a part of the wall of the sealed case and deforms so as to allow the capacity of the sealed space to vary corresponding to a change in the outside air pressure; a first PZT which contacts the first thin plate member to thereby detect the natural frequency of the first thin plate member; and a second thin plate member having the same vibration characteristics as those of the first thin plate member, the second thin plate member being provided outside the sealed case while contacting the sealed case; and a second PZT having the same temperature characteristics as those of the first PZT, the second PZT contacting the second thin plate member to thereby detect the natural frequency of the second thin plate member.

According to this aspect of the present invention, the sealed space formed inside the sealed case is in a vacuum state or is filled with air. When the air pressure sensor is located at a place with a prescribed pressure, the sealed space expands or contracts corresponding to the outside air pressure. According to the expansion or contraction, the first thin plate member deforms, so that the natural frequency thereof varies. By detecting the natural frequency of the first thin plate member using the first PZT, the natural frequency corresponding to the air pressure is detected, whereby the outside air pressure can be detected. Further, on the outside of the sealed case, the second thin plate member is provided so as to contact the sealed case. The second thin plate member has the same characteristics as those of the first thin plate member, but is not affected by a change in the outside air pressure. Therefore, by detecting the natural frequency of the second thin plate member and comparing it with the natural frequency of the first thin plate member, that is, by measuring a difference between the natural frequencies for example, the air pressure can be measured while eliminating the effects of the temperature drift of the first PZT and the second PZT having the same temperature characteristics. With this configuration, air pressure can be measured highly accurately with a simple configuration.

In this aspect of the present invention, the first thin plate member and the second thin plate member are made of the same material and are formed to have the same thickness. In particular, the first thin plate member extends such that the extended portion forms the second thin plate member. Since the first thin plate member and the second thin plate member are formed of the same member, comparison between the natural frequencies can be performed accurately, so air pressure can be detected with higher accuracy.

Further, in this aspect of the present invention, the air pressure sensor includes an integrated PZT in which the first PZT and the second PZT are integrally formed. In this case, the integrated PZT detects a combined frequency of the natural frequencies detected by the first PZT and the second PZT. Since the first PZT and the second PZT are formed of the same PZT, effects of the temperature drift can be eliminated from the natural frequencies detected by the respective PZTs with high accuracy, which enables to measure air pressure with higher accuracy. Particularly, by detecting the combined frequency in which the respective natural frequencies are combined in the same PZT, each of the natural frequencies can be calculated by the calculation device based on the combined frequency, and further, air pressure can be measured by calculating the difference between the natural frequencies. Thereby, a simple configuration can be realized.

Further, in this aspect of the present invention, the air pressure sensor further includes a PZT for vibration which vibrates the sealed case. Alternatively, the present invention may be configured such that the integrated PZT vibrates the sealed case. The PZT for vibration or the integrated PZT generates a stepped pulse signal to thereby vibrate the sealed case. Thereby, it is possible to vibrate the sealed case by the PZT for vibration or by the integrated PZT at a desired timing so as to detect the natural frequencies of the first and second thin plate members to thereby measure the air pressure, as described above.

Another aspect of the present invention is a hard disk drive equipped with the air pressure sensor described above (or an air pressure sensor unit including a calculation device). Particularly, the hard disk drive includes: an air pressure measuring device which measures outside air pressure according to the values detected by the first PZT and the second PZT of the air pressure sensor; and a flying height control device which controls the flying height of a magnetic head slider according to the outside air pressure measured. With this configuration, in the hard disk drive, the outside air pressure of the location can be measured based on the values detected by the PZTs of the air pressure sensor, and according to the measured value of the air pressure, the flying height of the magnetic head slider in which a minute flying height is required can be controlled. This enables to stabilize the flying height of the magnetic head slider, leading to an improvement in read/write accuracy of the hard disk drive.

Another aspect of the present invention is a method of manufacturing an air pressure sensor, including: a first step of configuring a sealed case with a sealed space formed therein including a thin plate member which constitutes at least a part of the wall of the sealed case and deforms so as to allow the capacity of the sealed space to vary corresponding to a change in the outside air pressure; and a second step of arranging a first PZT which detects the natural frequency of the thin plate member, such that the first PZT contacts the thin plate member, and arranging a second PZT which has the same temperature characteristics as those of the first PZT and detects the natural frequency of a thin plate member protrusion, such that the second PZT contacts the thin plate member protrusion. The thin plate member protrusion is formed by extending the thin plate member so as to protrude from the sealed case. Further, the second step is configured to arrange an integrated PZT in which the first PZT and the second PZT are integrally formed. The method further includes a third step of arranging a PZT for vibrating the sealed case, before or after the second step.

Still another aspect of the present invention is a method of measuring air pressure, including: a detection step to detect, by PZTs having the same temperature characteristics, the natural frequency of a first thin plate member which constitutes at least a part of the wall of a sealed case with a sealed space formed therein and deforms so as to allow the capacity of the sealed space to vary corresponding to a change in the outside air pressure, and the natural frequency of a second thin plate member which has the same vibration characteristic as that of the first thin plate member and is provided outside the sealed case so as to contact the sealed case, respectively; and an air pressure calculation step to calculate the air pressure according to the natural frequencies detected. The detection step is configured to detect a difference between the natural frequency of the first thin plate member and the natural frequency of the second thin plate member, and the air pressure calculation step is configured to calculate the air pressure based on the difference between the natural frequencies detected. The method further includes a vibration step to vibrate the sealed case before the detection step.

Still another aspect of the present invention is a method of controlling the flying height of a magnetic head slider including the method of measuring the air pressure described above. The method includes a flying height control step to control the flying height of the magnetic head slider according to the air pressure calculated, after the air pressure calculation step.

In the present invention which is configured and works as described above, by detecting the natural frequencies of the thin plate members formed of the same member in which one is affected by the air pressure but the other is not affected by the air pressure, the air pressure can be measured with high accuracy while eliminating the effects of temperature drift of the PZT working as a detection sensor. Therefore, the present invention has such an excellent effect that a highly accurate air pressure sensor is provided with a simple configuration, which cannot be achieved conventionally.

BRIEF DESCRIPTION OF THE DRAWINGS

FIGS. 1A, 1B, 1C and 1D illustrate an exemplary basic configuration of a sealed case, in which FIG. 1A shows a base, FIG. 1B shows a configuration in which a ring is mounted thereon, FIG. 1C shows a configuration in which a vibration plate is mounted on the ring, and FIG. 1D is a cross-sectional view of FIG. 1C;

FIGS. 4A, 4B and 4C illustrate a method of measuring air pressure, in which FIG. 4A shows relationships between air pressure and frequencies of PZTs, FIG. 4B shows relationships between frequencies of the PZTs and temperature drift in a high pressure state, and FIG. 4C shows relationships between frequencies of the PZTs and temperature drift in a low pressure state;

DESCRIPTION OF PREFERRED EMBODIMENTS

An air pressure sensor in the present invention is characterized as to include a vibration member in which the natural frequency thereof varies affected by the air pressure, and a vibration member in which the natural frequency thereof does not vary due to the air pressure, and to detect the respective natural frequencies. Thereby, the air pressure can be measured while eliminating effects of the temperature drift of a PZT working as a detection sensor. Hereinafter, the specific configuration of an air pressure sensor will be described by way of an exemplary embodiment. Further, as an exemplary use of the air pressure sensor, a case that the sensor is provided in a hard disk drive will be described. Note that use of the air pressure sensor is not limited to the one shown below.

First Embodiment

Figure 3A:
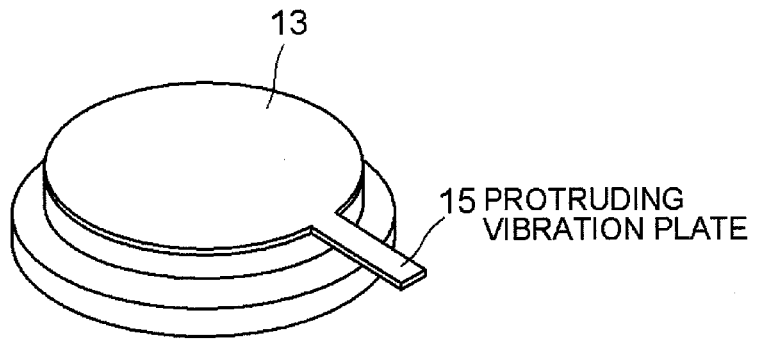
FIGS. 3A and 3B illustrate a configuration of a sealed case according to a first embodiment.
Figure 3B:
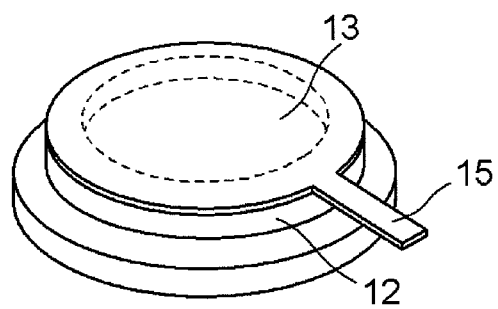
Figure 4A:
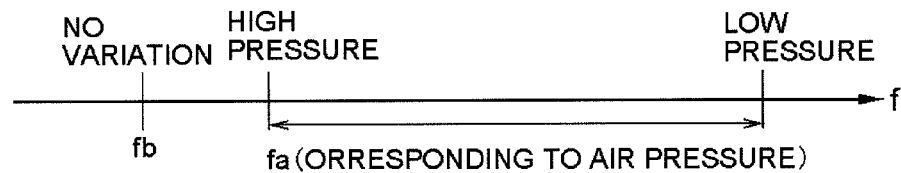
Figure 4B:
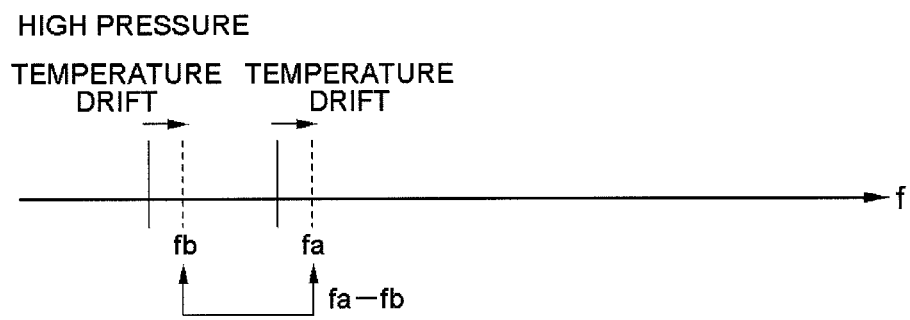
Figure 4C:
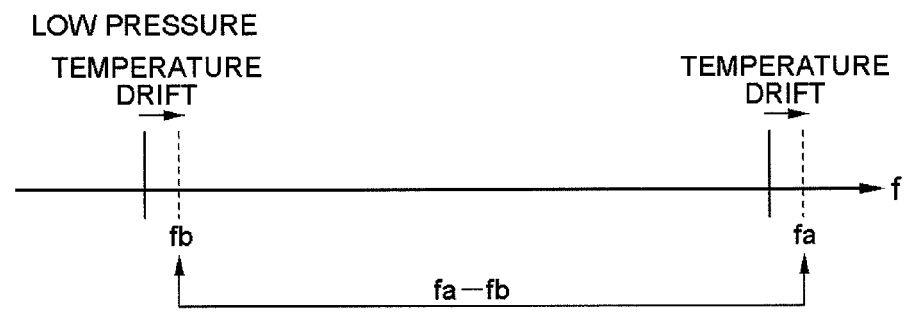
Figure 5A:
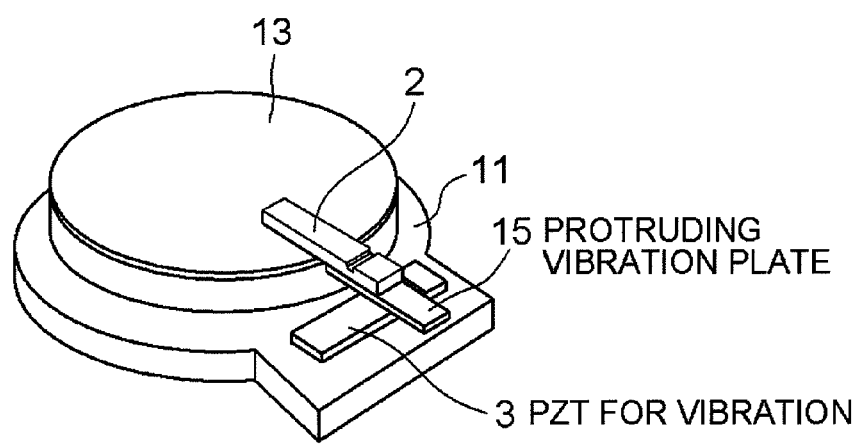
FIGS. 5A and 5B illustrate a state where a PZT for vibration is mounted on the sealed case disclosed in FIG. 3C.
Figure 5B:
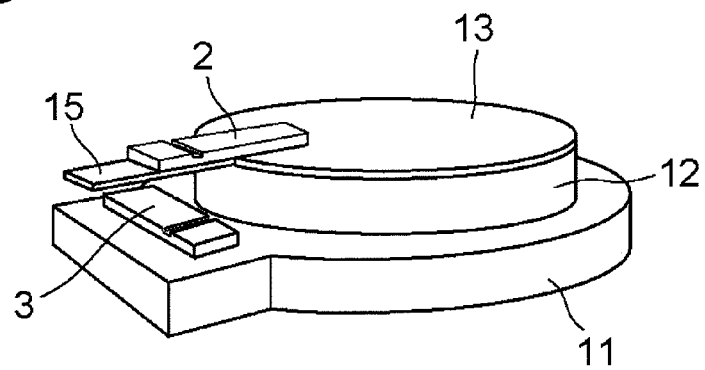
Figure 6:
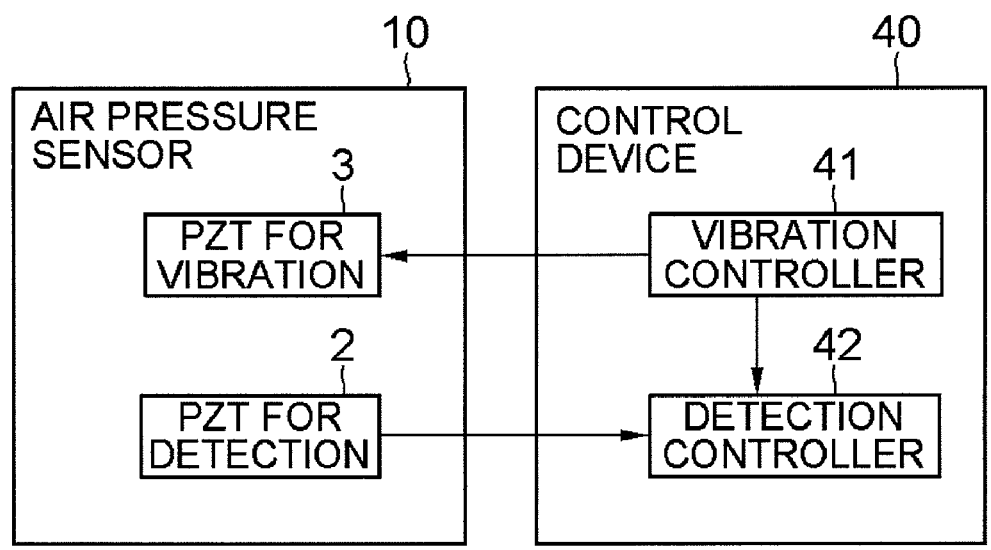
FIG. 6 is a block diagram showing an exemplary configuration of an air pressure sensor and a control device which controls the operation thereof.
Figure 7:
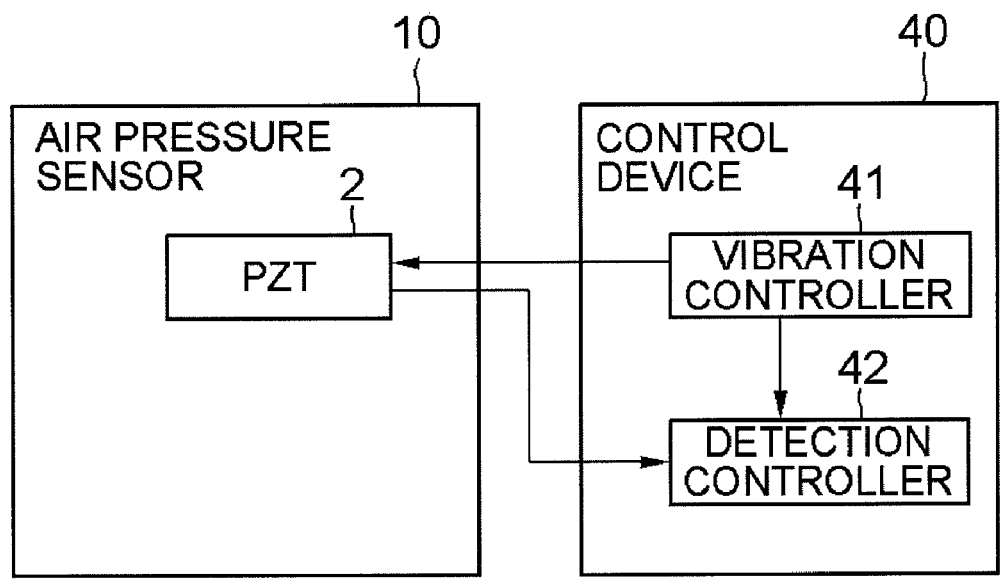
FIG. 7 is a block diagram showing another exemplary configuration of an air pressure sensor and a control device which controls the operation thereof.
Figure 8:
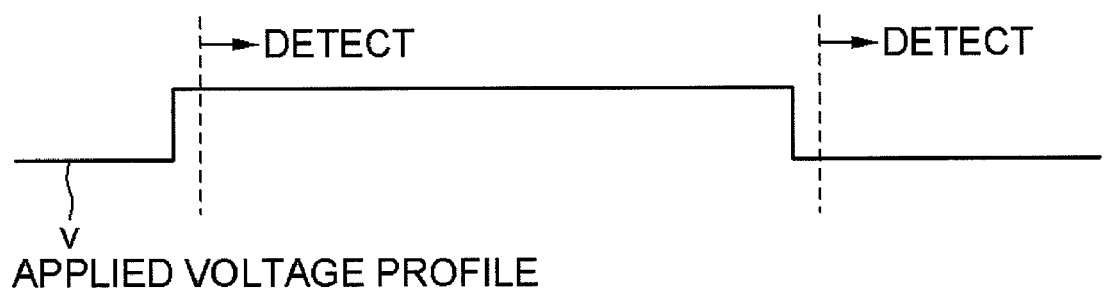
FIG. 8 illustrates operation of a control device.
Figure 9:
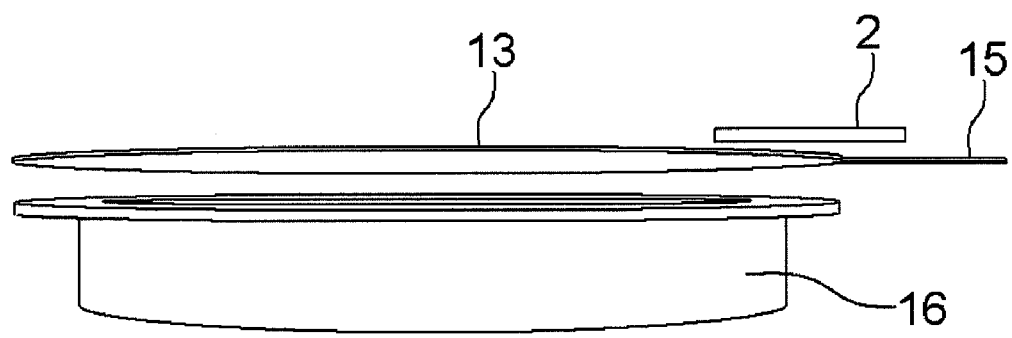
FIG. 9 illustrates another exemplary configuration of a sealed case.
Figure 9:
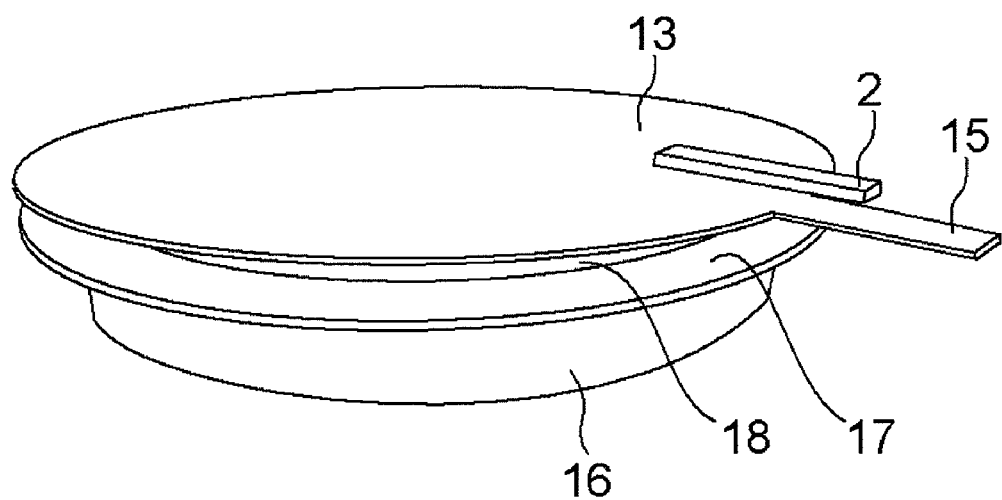

A first embodiment of the present invention will be described with reference to FIGS. 1A to 9. FIGS. 1A to 3C illustrate the configuration of an air pressure sensor. FIGS. 4A to 4C illustrate a method of measuring air pressure. FIGS. 5A, 5B and 6 illustrate the configuration of an air pressure sensor. FIGS. 7 and 8 illustrate the configuration of an air pressure sensor in a variation. FIG. 9 illustrates another exemplary configuration of an air pressure sensor.

[Configuration]

An air pressure sensor of the present embodiment includes a sealed case 1 having a sealed space 14 formed therein. An exemplary configuration and a manufacturing method of the sealed case 1 will be described with reference to FIGS. 1A to 3C.

FIGS. 1A to 1D illustrate the basic configuration of a sealed case 1. The sealed case 1 is made of stainless, and includes a discoid base 11 serving as the bottom plate, a ring 12 serving as the side wall, and a thin, discoid vibration plate 13 (first thin-plate member) serving as the upper lid. Specifically, the base 11 (see FIG. 1A) is a member having a 3 mm diameter and a 200 to 400 μm thickness for example, which is less likely to be deformed and has relatively high rigidity. The ring 12 (see FIG. 1B) mounted on the base 11 is a member having a 2.4 mm diameter and a 200 to 400 μm thickness, which is slightly smaller than the outer shape of the base 11 and is less likely to be deformed and has a relatively high rigidity, same as the base 11. The vibration plate 13 (see FIG. 1C) is a member which is mounted on the ring 12 so as to close the upper opening of the space defined by the base 11 and the ring 12 to thereby form the sealed space 14. The vibration plate 13 has a diameter of the same size as the ring 12, that is, 2.4 mm, and has an 18 μm thickness, so it is formed to be thinner than the base 11 and the ring 12.

Figure 1A:
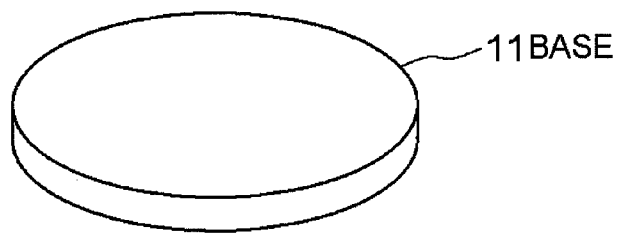
Figure 1B:
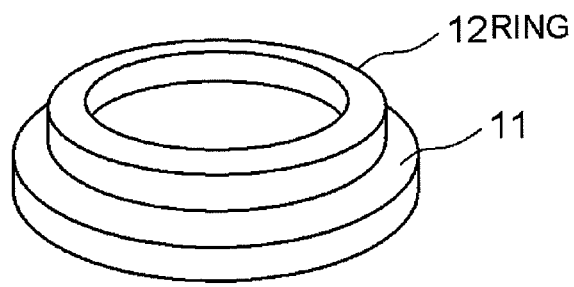
Figure 1C:
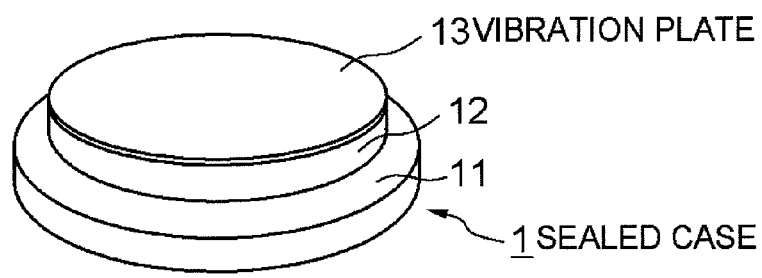
Figure 1D:
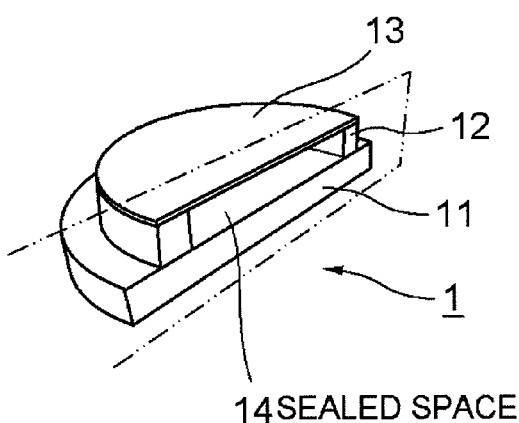

The base 11, the ring 12 and the vibration plate 13 are firmly bonded through the contacting surfaces with one another by diffusion bonding, welding, brazing, resining, or the like, to thereby form the sealed case 1 having a substantially cylindrical outer appearance, as shown in FIG. 1C. As shown in the cross-sectional view taken along the alternate long and two short dashes lines in FIG. 1D, the inner space 14 formed inside the sealed case 1 is in a sealed state where air cannot be flown in or out, by the bonding described above. The inner space 14 may be vacuum or filled with air.

The vibration plate 13 is formed to have a strength (thickness) which allows the capacity of the sealed space 14 to vary corresponding to changes in the outside air pressure of the sealed case 1. For instance, when the sealed case 1 working as an air pressure sensor is positioned at a place with a prescribed air pressure, the sealed space 14 expands or contracts corresponding to the outside air pressure. In order to enable the expansion or contraction, the vibration plate 13 deforms to expand upward or dent downward. Assuming that the sealed space 14 is filled with air and the inside air pressure is 1033 hpa (0 m above sea level), when the sealed case 1 is moved to a place of 3000 m above sea level, the outside air pressure drops to 704 hpa, so the air inside the case expands, whereby the vibration plate 13 deforms to expand upward. The amount of deformation forms a function of outside air pressure. Consequently, the vibration plate 13 is drawn to the periphery due to the bonding with the ring 12, so the natural frequency of the vibration plate 13 also changes. In other words, the tension force of the vibration plate 13 can be shown as a function of air pressure, so that the natural frequency also changes as a function of air pressure. For instance, the natural frequency of the vibration plate 13 varies about 30 kHz between 0 to 3000 m above sea level due to a change in the air pressure, as described above. In such a case, the amount of change in the natural frequency corresponding to the change in the air pressure may provide a resolution of 10 Hz/m.

Figure 2A:
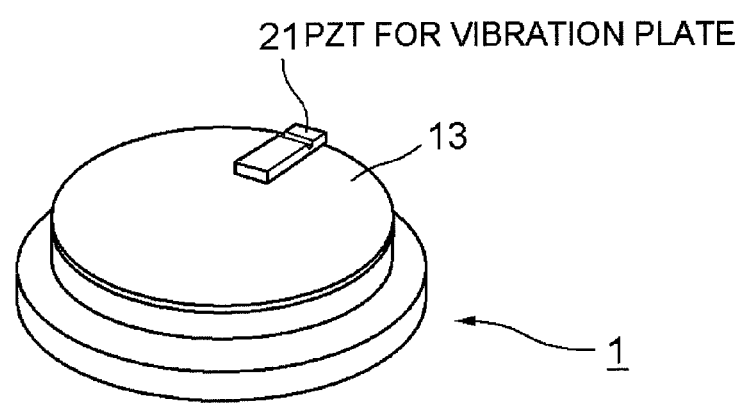
FIGS. 2A and 2B illustrate an exemplary basic configuration of the sealed case in which a PZT is mounted on the vibration plate.
Figure 2B:
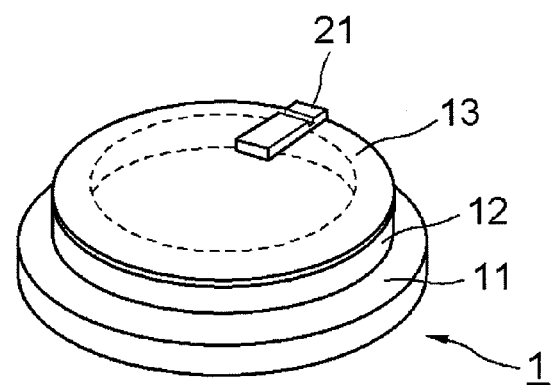

As described above, in order to measure the air pressure using the sealed case 1, it is only necessary to measure the natural frequency of the vibration plate 13. Therefore, as shown in FIG. 2A, the PZT (first PZT) 21 which detects the natural frequency of the vibration plate 13 is provided so as to contact the vibration plate 13. Note that in FIG. 2B, the ring 12 is indicated by dotted lines to show the positioning relationship between the PZT 21 for vibration plate and the ring 12.

In the present embodiment, the configuration described below is adopted to compensate for the temperature drift of the PZT 21. As shown in FIG. 3A, a protruding vibration plate 15 (second thin plate member, thin plate member protrusion) in a substantially oblong shape extends outward from a part of the outer periphery of the vibration plate 13. The protruding vibration plate 15 is integrally formed with the vibration plate 13, so it is made of the same material and has the same thickness. Namely, the protruding vibration plate 15 has a thickness of 18 μm same as that of the vibration plate 13, which is thinner compared with the base 11 and the ring 12. Therefore, the vibration plate 13 and the protruding vibration plate 15 have the same vibration characteristics in the normal state. Further, since the protruding vibration plate 15 extends outward from the outer periphery of the vibration plate 13, it protrudes from the outer shape of the ring 12 as shown in FIG. 3B. The protruding vibration plate 15 is so formed that one end is linked with the vibration plate 13 and supported by the ring 12 while the other end is formed as a free end, so it is arranged in a cantilever shape. As such, when vibration is caused in the sealed case 1, the protruding vibration plate 15 also vibrates. However, even if the tension of the vibration plate 13 changes due to a change in the air pressure so that the natural frequency of the vibration plate 13 varies, the protruding vibration plate 15 will not be affected by the change in the air pressure since it extends from the sealed case 1, so the natural frequency of the protruding vibration plate 15 will not change. In other words, since the protruding vibration plate 15 is integrated with the vibration plate 13, they share the same natural frequency when an air of 1033 hpa is filled in the sealed case so that they are in such an air pressure state, but they have different natural frequencies respectively when they are in other air pressure states (other than 1033 hps).

Figure 3C:
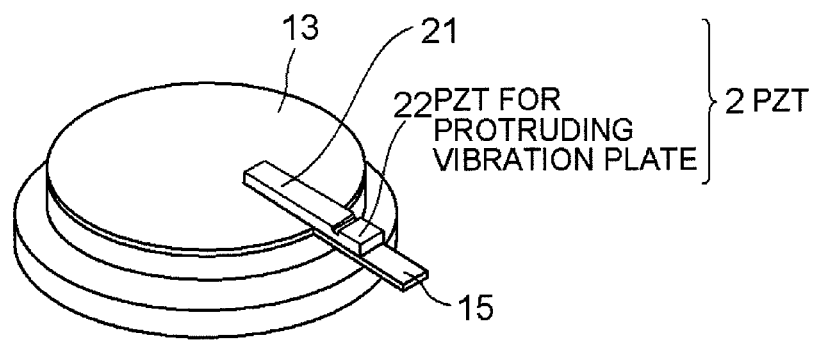
FIG. 3C illustrates a configuration in which a PZT is mounted on the vibration plate of the sealed case according to the first embodiment disclosed in FIG. 3A.

Further, as shown in FIG. 3C, a PZT 22 for protruding vibration plate (second PZT), which detects the natural frequency of the protruding vibration plate 15, is mounted on the protruding vibration plate 15 in the present embodiment. In particular, the PZT 22 for protruding vibration plate and the PZT 21 for vibration plate are formed integrally of a PZT 2 in one rod shape (integrated PZT) in the present embodiment. In other words, one PZT 2 is arranged on the vibration plate 13 and on the protruding vibration plate 15 over the ring 12, in which the part constituting the PZT 21 for vibration plate is disposed on the vibration plate 13, and the part constituting the PZT 22 for protruding vibration plate is disposed on the protruding vibration plate 15, respectively. Since the PZT 21 and the PZT 22 are integrated, they have the same temperature characteristics, that is, they have the same temperature drift characteristics in which detected natural frequencies vary depending on the temperature changes. Accordingly, by calculating a difference between the natural frequencies detected in the PZT 21 and the PZT 22, the temperature drift of the PZT 2 can be eliminated. This will be described with reference to FIG. 4.

It is assumed that the natural frequency of the vibration plate 13 is "fa" and the natural frequency of the protruding vibration plate 15 is "fb". Since the protruding vibration plate 15 is not affected by the air pressure, the natural frequency thereof will not vary, but the natural frequency of the vibration plate 13 varies depending on changes in the outside air pressure (see FIG. 4A). In other words, the natural frequency fa of the vibration plate 13 detected in the PZT 21 for vibration plate is shown as a function of outside air pressure. Since the PZT 21 for vibration plate and the PZT 22 for protruding vibration plate involve the temperature drift as described above, the actual values detected by the PZT 21 and the PZT 22 shift as shown by the dotted lines in FIGS. 4B and 4C. However, since the PZT 21 and the PZT 22 have the same temperature drift because they are formed of the same PZT 2, the temperature drift can be eliminated by calculating a difference between the detected natural frequencies fa and fb, that is, "fa−fb". In other words, by detecting the difference "fa−fb" between the natural frequencies, "fa−fb" becomes a function of air pressure with reference to fb, so a change in the air pressure can be measured with high accuracy. The difference "fa−fb" between the natural frequencies can be measured by reading the frequencies detected by the PZT 2 in which the PZT 21 and the PZT 22 are formed integrally. In other words, in the PZT 2, the combined frequency of the natural frequencies caused in the vibration plate 13 and in the protruding vibration plate 15 can be detected. Therefore, by detecting the combined frequency and performing predetermined computation, the difference "fa−fb" between the natural frequencies can be measured.

For example, the natural frequencies fa and fb can be calculated from a detected value of the PZT 2 in the following manner. First, a signal detected from the PZT 2 is a time signal, and a damped vibration (fa+fb) in which the frequencies fa and fb are combined is detected. Then, the combined frequency is sampled and the obtained data is decomposed into respective frequencies through discrete FFT (DFT), whereby fa and fb are detected. At this time, by performing the process repeatedly so as to average them, the data accuracy can be improved. If the natural frequency of the vibration plate is high, it can be coped by increasing the sampling frequency. Further, it is preferable to amplify the output voltage of the PZT.

Since the vibration plates 13 and 15 are required to vibrate in order to detect the natural frequencies of the vibration plate 13 and the protruding vibration plate 15, a PZT 3 for vibration may be provided. For example, as shown in FIGS. 5A and 5B, the PZT 3 for vibration may be provided on the base 11 of the sealed case 1 in addition to the PZT 2 for detection, and a voltage is applied to the PZT 3 for vibration so as to vibrate the sealed case 1. In this case, in order to actually vibrate the sealed case 1, that is, the air pressure sensor 10, to thereby detect the natural frequency, a control device 40 (computation device) to control vibration and detection is required. FIG. 6 shows an exemplary configuration to control detection by the air pressure sensor 10. As shown in FIG. 6, the air pressure sensor 10 including the PZT 2 and the PZT 3 is connected with the control device 40 to thereby constitute an air pressure sensor unit. In the control device 40, prescribed programs are installed, whereby a vibration controller 41 and a detection controller 42 are configured. The vibration controller 41 applies a voltage to the PZT 3 for vibration to thereby vibrate the sealed case 1, and notifies the detection controller 42 of the start of vibration. Similarly, the vibration controller 41 stops application of voltage to the PZT 3 for vibration to thereby vibrate the sealed case 1, and notifies the detection controller 42 of the start of vibration. Immediately after receiving the notification of the start of vibration from the vibration controller 41, the detection controller 42 detects the values of the natural frequencies detected by the PZT 2 for detection, and calculates the difference "fa−fb" thereof. Then, the detection controller 42 or another computation device calculates the air pressure value according to the values of the natural frequencies detected.

It is also acceptable to use the PZT 2 for detection as a PZT for vibration, without providing the PZT 3. In such a case, the vibration controller 41 and the detection controller 42 constructed in the control device 40 operate for one PZT 2, as shown in FIG. 7. The vibration controller 41 applies a stepped pulse voltage to the PZT 2 for vibrating the PZT 2 as shown in the signal V in FIG. 8, or stops the applied stepped voltage. When the vibration controller 41 applies the voltage or stops the voltage, it notifies the detection controller 42 of the start of vibration. Immediately after receiving the notification of the start of vibration, the detection controller 42 operates to detect the natural frequency detected by the PZT 2, as shown by the dotted lines in FIG. 8. Thereby, one PZT 2 can be used for vibration and detection by switching it.

Note that as the PZT 3 for vibration and the PZT 2 for vibration and detection, a PZT of thin-film layered type may be used. By using a PZT of thin-film layered type, it is possible to vibrate with a smaller voltage applied. Therefore, although it is necessary that an air pressure sensor operates constantly to measure air pressure as described later, power consumption required for operation can be reduced.

[Manufacturing Method]

Next, a method of manufacturing the air pressure sensor 10 described above will be explained. As shown in FIGS. 1A to 1D, the base 11, the ring 12 and the vibration plate 13 are piled up so as to form the sealed space 14 inside, and are firmly fixed to thereby constitute the sealed case 1 (first step). Since the vibration plate 13 is formed such that the protruding vibration plate 15 extends therefrom in this example, the sealed case 1 as shown in FIG. 3A is formed.

Then, the PZT 2 in which the PZT 21 and the PZT 22 are integrally formed is arranged such that the PZT 21 for vibration plate is disposed on the vibration plate 13 and the PZT 22 for protruding vibration plate is disposed on the protruding vibration plate 15, respectively (second step).

Further, as shown in FIGS. 5A and 5B, the PZT 3 for vibration is disposed on the base 11 of the sealed case 1 (third step). The PZT 3 for vibration may be provided to the sealed case 1 before disposing the PZT 2 for detection. Alternatively, the PZT 3 for vibration may not be provided. In such a case, the PZT 2 for detecting vibration is also used for vibration.

The air pressure sensor 10 is configured in this manner. Then, it is mounted on equipment or a place where the sensor is required, and signal lines which are to be connected with the control device 40 are connected to the PZTs 2 and 3.

[Operation]

Next, operation of the air pressure sensor 10, configured as described above and controlled by the control device 40, will be described. First, when a vibration instruction is given from the control device 40 to the PZT 3 for vibration or to the PZT 2, that is, when application of voltage or applied voltage is turned off, the PZT 3 for vibration or the PZT 2 is excited, whereby the sealed case 1 is vibrated (vibration step).

Immediately after the vibration, the control device 40 detects a combined frequency of the natural frequency fa of the vibration plate 13 and the natural frequency fb of the protruding vibration plate 15 which is detected by the PZT 2 for detection (detection step). Then, based on the detected combined frequency, the difference "fa−fb" is calculated through prescribed computation by the control device 40 or another computation device, and the outside air pressure is calculated based on the difference "fa−fb" (air pressure computation step). In this step, the value of the outside air pressure is calculated with use of the difference "fa−fb" between the natural frequencies, by referring to the predetermined correspondence table of the difference between the natural frequencies and the air pressure stored in the control device 40, or performing calculation using a predetermined calculating formula.

As described above, since the air pressure sensor 10 including the sealed case 1 and the PZT 2 (or PZTs 2 and 3) is configured in the present invention, the value of outside air pressure can be measured based on the natural frequency of the PZT 2. In particular, since the difference between the natural frequency of the vibration plate 13 affected by the air pressure and the natural frequency of the protruding vibration plate 15 not affected by the air pressure is detected, the value of the air pressure can be measured with high accuracy while suppressing the temperature drift of the PZT 2.

Note that the shape of the sealed case 1 described above is an example, and is not limited thereto. Further, although the configuration in which the vibration plate 13 constitutes a part of the wall of the sealed case 1 has been exemplary shown, a configuration in which another wall of the sealed case 1 is formed of a thin plate same as the vibration plate 13 is also acceptable. Further, the sealed case 1 may be configured as shown in FIG. 9, for example. The sealed case 1 shown in FIG. 9 includes a dented dish 16 in which the base 11 and the ring 12 are formed integrally, and the vibration plate 13 in which the protruding vibration plate 15 is formed. Specifically, the dented dish 16 is made of a stainless thin plate which is draw-processed by press, so a dent 18 having a predetermined depth is formed in the center. The dent 18 has a ring flange 17 formed around the opening thereof, to which the vibration plate 13 is bonded. Thereby, the dent 18 is sealed with the vibration plate 13 to thereby form the sealed space. With the sealed case 1 made of stainless as described above, the shape can be molded easily. Therefore, a small electronic component can be manufactured with high accuracy at low cost without introducing a semiconductor process.

Although the configuration in which the PZT 21 for vibration plate and the PZT 22 for protruding vibration plate are formed integrally as the PZT 2 has been described above, they may be formed separately and provided to the vibration plate 13 and the protruding vibration plate 15, respectively.

Further, although the configuration of applying a stepped pulse signal including a plurality of frequencies, when the PZTs 2 and 3 vibrate, has been described exemplary, it is also acceptable to vibrate the sealed case 1 by applying a signal in another state such as sine wave vibration.

In the case of providing the PZT 3 for vibration, the PZT 3 is preferably arranged such that the PZT 3 and the PZT 2 for detection are in parallel to each other. In such a case, the vibration of the vibration plates 13 and 15 becomes large, so that a detection signal can be read easily.

Second Embodiment

Figure 10:
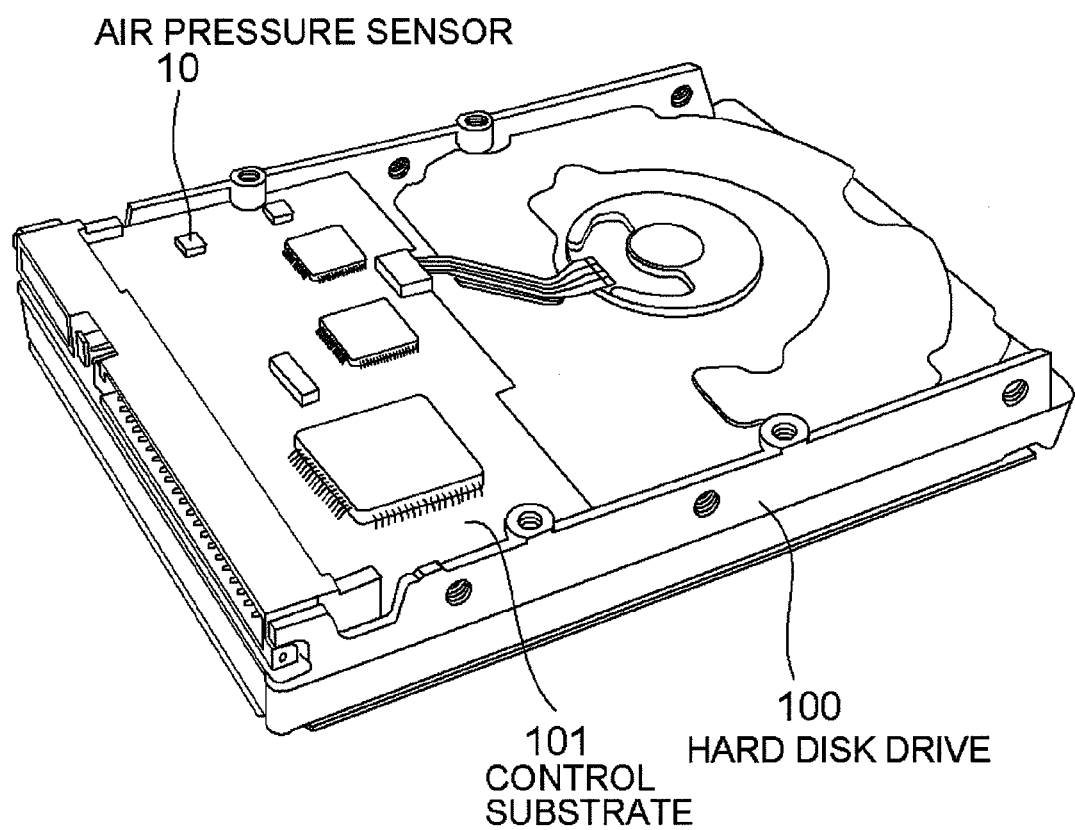
FIG. 10 schematically illustrates the configuration of a hard disk drive equipped with an air pressure sensor of a second embodiment.

Next, a second embodiment of the present invention will be described with reference to FIGS. 10 and 11. In the present embodiment, the air pressure sensor described above is mounted on a hard disk drive. Hereinafter, the configuration and operation will be described in detail. FIG. 10 shows the internal configuration of the hard disk drive, and FIG. 11 is a configuration block diagram.

A hard disk drive 100 of the present embodiment includes a head gimbal assembly mounting a magnetic disk and a magnetic head, and a control substrate 101, and adopts a configuration same as that of a typical hard disk drive. Further, the air pressure sensor 10 having the same configuration as that described above in the first embodiment, including at least the sealed case 1 and the PZT 2, is mounted on the control substrate 101. The PZT 3 for vibration may be provided, and a case covering the sealed case 1 may also be provided. The air pressure sensor 10, in particular, the PZT 2, is connected to the control device 120 mounted on the control substrate 101 and the operation thereof is controlled. Note that the mounting position of the air pressure sensor 10 is just an example, so the air pressure sensor 10 may be mounted on another place.

Figure 11:
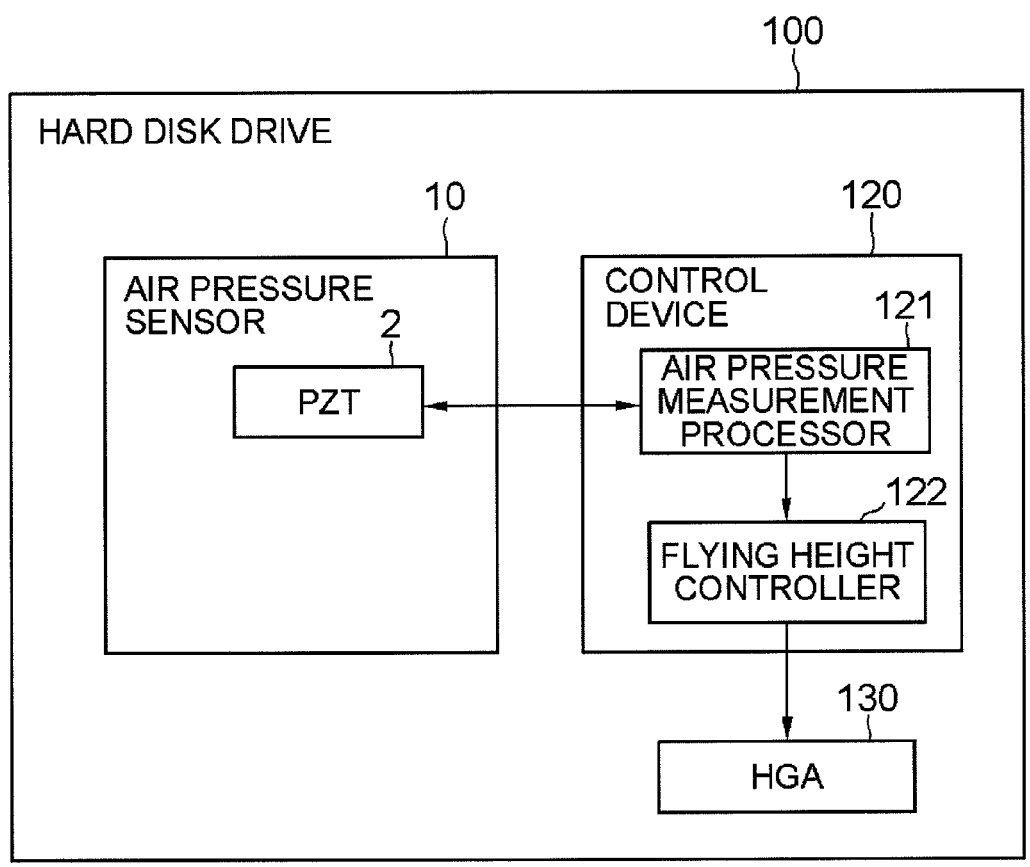
FIG. 11 is a block diagram showing the configuration of the hard disk drive disclosed in FIG. 10.

In the control device 120, predetermined programs are installed, so that an air pressure measurement processor 121 (air pressure measurement device) and a flying height controller 122 (flying height control device) are constructed as shown in FIG. 11. The air pressure measurement processor 121 operates same as the vibration controller 41 and the detection controller 42 described in the first embodiment. For example, the air pressure measurement controller 121 provides a vibration instruction to the PZT 2 of the air pressure sensor 10 (vibration step), and detects the frequencies detected from the vibration plates 13 and 15 (detection step). Then, based on the detected frequencies, the air pressure measurement controller 121 calculates the value of the outside air pressure (air pressure calculation step), and notifies the flying height controller 122 of the calculated value of the outside air pressure. According to the measured value of the outside air pressure, the flying height controller 122 controls the flying height of the magnetic head slider with respect to the magnetic disk (flying height control step). This is performed because the magnetic head slider may not be controlled at a desired flying height due to a change in the air pressure so that the magnetic head slider may fly too high or too low.

Note that the flying height of the magnetic head slider may be controlled by varying the mounting height of the head gimbal assembly with respect to the magnetic disk, or may be controlled by regulating the air flow amount flown between the magnetic disk and the magnetic head slider while expanding or contracting a stretch member provided on the air flowing side of the magnetic head slider as disclosed in Japanese Patent Application Laid-Open No. 2006-114202. Alternatively, it is also acceptable to use a technique called thermal protrusion in which a heating element such as a resistance or a coil or a micro thermal actuator is provided in a magnetic head slider and a protrusion is caused on the ABS by heating the heating element or the like to thereby regulate the flying height. Note that any method of controlling the flying height of the magnetic head slider can be used.

As described above, in the hard disk drive 100 according to the present embodiment, outside air pressure of the disposed place can be measured based on the value detected from the PZT 2 of the air pressure sensor 10. Corresponding to the measured air pressure, the flying height of the magnetic head slider in which a micro flying height is required can be controlled properly. This enables to stabilize the flying height of the magnetic head slider, so that the read/write accuracy of the hard disk drive 100 can be improved.

Although an example of providing the air pressure sensor 10 on the control substrate 101 of the hard disk drive 100, as shown in FIG. 10, has been described above, it is preferable to provide the air pressure sensor 10 particularly in the internal space (magnetic disk storing part) where a magnetic disk (not shown) is stored, of the inner part of the hard disk drive 100. Since the air pressure in the magnetic disk storing part may differs from that of the outside due to heating, the air pressure in the space affecting the flying height of the magnetic head slider can be measured with high accuracy. Thereby, the flying height of the magnetic head slider can be controlled more properly.

INDUSTRIAL APPLICABILITY

The air pressure sensor according to the present invention can be mounted on an electric device such as a hard disk drive which is affected by air pressure or can be used in an altimeter, so the air pressure sensor has industrial applicability.

What is claimed is:

1. An air pressure sensor, comprising:
a sealed case within which a sealed space is provided therein;
a first thin plate member which comprises at lease a part of a wall of the sealed case and deforms so as to allow a capacity of the sealed space to vary in accordance with a change in outside air pressure;

a first PZT which contact the first thin plate member to thereby detect a natural frequency of the first thin plate member; and a second thin plate member having a same vibration characteristic as a vibration characteristic of the first thin plate member, the second thin plate member being provided so as to protrude outside of the sealed case while contacting the sealed case; and a second PZT having a same temperature characteristic as a temperature characteristic of the first PZT, the second PZT contacting the second thin plate member to thereby detect a natural frequency of the second thin plate member.

2. The air pressure sensor according to claim 1, wherein the first thin plate member and the second thin plate member are of a same material and have a same thickness.

3. The air pressure sensor according to claim 2, wherein the first thin plate member extends such that an extended portion forms the second thin plate member.

4. The air pressure sensor according to claim 1, comprising an integrated PZT in which the first PZT and the second PZT are integrally formed.

5. The air pressure senor according to claim 4, wherein the integrated PZT detects a combined frequency of the natural frequency detected by the first PZT and the natural frequency detected by the second PZT.

6. The air pressure sensor according to claim 1, further comprising a PZT for vibration which vibrates the sealed case.

7. The air pressure sensor according to claim 4, wherein the integrated PZT vibrates the sealed case.

8. The air pressure sensor according to claim 6, wherein the PZT for vibration generates a stepped pulse signal to thereby vibrate the sealed case.

9. The air pressure sensor according to claim 7, wherein the integrated PZT generates a stepped pulse signal to thereby vibrate the sealed case.

10. An air pressure sensor unit comprising:
the air pressure sensor according to claim 1; and
a calculator which calculates a difference between the natural frequency of the first PZT and the natural frequency of the second PZT detected by the air pressure sensor.

11. The air pressure sensor unit according to claim 10, comprising an integrated PZT in which the first PZT and the second PZT are integrally formed, wherein
the integrated PZT detects a combined frequency of the natural frequency detected by the first PZT and the natural frequency detected by the second PZT, and
the calculator calculates the natural frequency of the first PZT and the natural frequency of the second PZT respectively based on the combined frequency detected by the integrated PZT, and calculates the difference between the natural frequency of the first PZT and the natural frequency of the second PZT.

12. A hard disk drive, the air pressure sensor according to claim 1 being provided within the hard disk drive.

13. A hard disk drive comprising the air pressure sensor unit according to claim 10.

14. The hard disk drive according to claim 12, further comprising:
an air pressure measurer which measures an outside air pressure according to values detected by the first PZT and the second PZT of the air pressure sensor provided within the hard disk drive; and a flying height controller which controls a flying height of a magnetic head slider with respect to a magnetic disk according to the outside air pressure measured, the magnetic disk and the magnetic head slider being provided within the hard disk drive.

15. The hard disk drive according to claim 13, further comprising:
an air pressure measurer which measures an outside air pressure according to values detected by the first PZT and the second PZT of the air pressure sensor provided within the hard disk drive; and a flying height controller which controls a flying height of a magnetic head slider with respect to a magnetic disk according to the outside air pressure measured, the magnetic head slider and the magnetic disk being provided within the hard disk drive.

16. A method of manufacturing an air pressure sensor, comprising:
configuring a sealed case within which a sealed space is provided and including a thin plate member which comprises at least a part of a wall of the sealed case and deforms so as to allow a capacity of the sealed space to vary in accordance with a change in outside air pressure; and arranging a first PZT which detects a natural frequency of the thin plate member, such that the first PZT contacts the thin plate member, and arranging a second PZT which has a same temperature characteristic as a temperature characteristic of the first PZT and detects a natural frequency of a thin plate member protrusion, such that the second PZT contacts the thin plate member protrusion, the thin plate member protrusion being provided by extending the thin plate member so as to protrude from the sealed case.

17. The method of manufacturing the air pressure sensor according to claim 16, wherein
the arranging comprises, arranging an integrated PZT in which the first PZT and the second PZT are integrally formed.

18. The method of manufacturing the air pressure sensor according to claim 16, further comprising; further arranging a PZT for vibrating the sealed case, before or after the arranging.

19. A method of measuring air pressure comprising:
detecting, by PZTs having a same temperature characteristic, a natural frequency of a first thin plate member which comprises at least a part of a wall of a sealed case within which a sealed space is provided and deforms so as to allow a capacity of the sealed space to vary in accordance with a change in outside air pressure, and a natural frequency of a second thin plate member which has a same vibration characteristic as a vibration characteristic of the first thin plate member and is provided so as to protrude outside the sealed case while contacting the sealed case; and calculating air pressure according to the natural frequencies detected.

20. The method of measuring the air pressure according to claim 19, wherein
the detecting comprises, detecting a difference between the natural frequency of the first thin plate member and the natural frequency of the second thin plate member, and
the calculating comprises, calculating the air pressure based on a difference between the natural frequencies detected.

21. The method of measuring the air pressure according to claim 19, further comprising, vibrating the sealed case before the detecting.

22. A method of controlling a flying height of a magnetic head slider with respect to a magnetic disk, the magnetic head slider and the magnetic disk being within a hard disk drive, including the method of measuring the air pressure according to claim 19, the method of controlling comprising controlling the flying height of the magnetic head slider in accordance with to the air pressure calculated, after the calculating of the air pressure.

* * * * *

UNITED STATES PATENT AND TRADEMARK OFFICE
CERTIFICATE OF CORRECTION

PATENT NO. : 7,555,947 B2 Page 1 of 1
APPLICATION NO. : 11/855444
DATED : July 7, 2009
INVENTOR(S) : T. Kasajima et al.

It is certified that error appears in the above-identified patent and that said Letters Patent is hereby corrected as shown below:

At column 10, line 66 (claim 1, line 4) of the printed patent, "lease" should read --least--.

Signed and Sealed this

Sixteenth Day of February, 2010

David J. Kappos
*Director of the United States Patent and Trademark Office*